(12) United States Patent
Aramaki

(10) Patent No.: US 6,348,839 B1
(45) Date of Patent: Feb. 19, 2002

(54) DELAY CIRCUIT FOR RING OSCILLATOR

(75) Inventor: Yoshinori Aramaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/498,993

(22) Filed: Feb. 7, 2000

(30) Foreign Application Priority Data

Feb. 10, 1999 (JP) .......................................... 11-033488

(51) Int. Cl.[7] .......................... H03K 5/13; H03B 27/00
(52) U.S. Cl. ........................ 331/57; 327/262; 327/266; 327/274; 327/280
(58) Field of Search ........................... 331/57; 327/262, 327/266, 274, 280

(56) References Cited

U.S. PATENT DOCUMENTS 5,686,867 A * 11/1997 Sutardja et al. ............... 331/57
5,717,362 A * 2/1998 Maneatis et al. ............. 331/57

OTHER PUBLICATIONS

J. Meneatis, "Low–Jitter Process–Independent DLL and PLL Based on Self–Biased Techniques", IEEE Journal fo Solid–State Circuits, vol. 31, No. 11, Nov. 1996.

* cited by examiner

Primary Examiner—Arnold Kinkead
(74) Attorney, Agent, or Firm—Whitham, Curtis & Christofferson, PC

(57) ABSTRACT

A delay circuit for a ring oscillator includes a first electric potential line, a pair of output lines, a pair of two first transistors arranged between the first electric potential line and the pair of output lines, respectively, a second electric potential line, and a pair of two second transistors arranged between the second electric potential line and the pair of output lines, respectively. Respective gates of the first transistors are connected to the pair of output lines, respectively, the first transistors, and the second transistors are connected to each other center-symmetrically, and the output lines are connected to a third electric potential line. Such a circuit can easily realize a differential gain of more than or equal to 1 and an in-phase gain of less than or equal to 1.

20 Claims, 6 Drawing Sheets

FIG.8
CONVENTIONAL
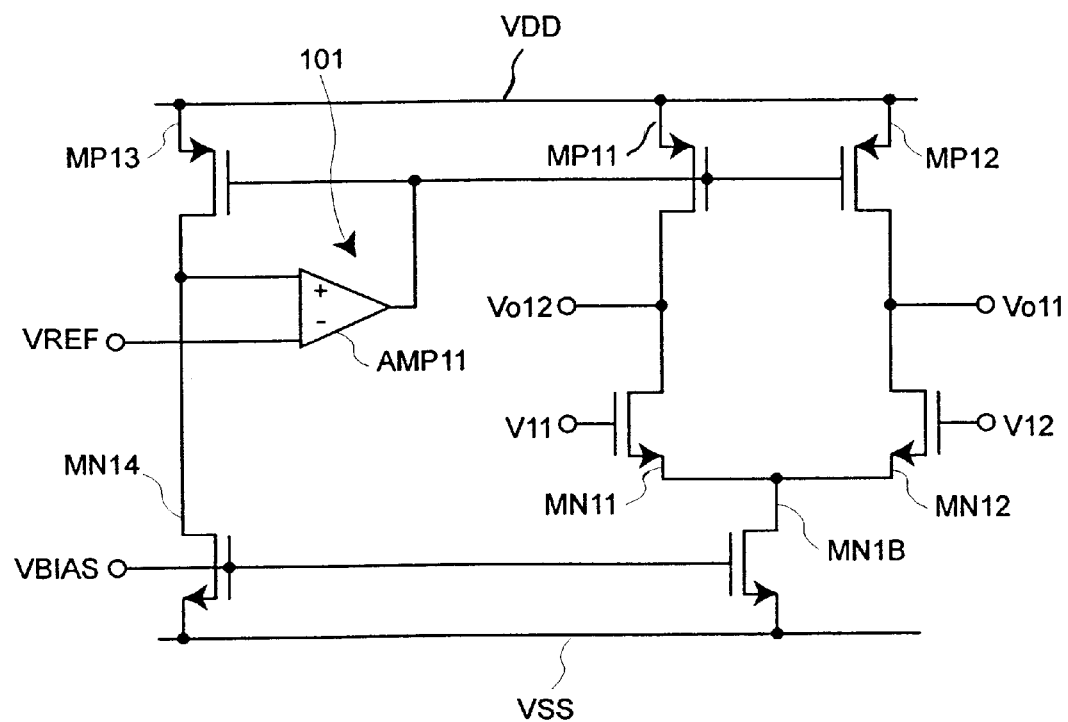

DELAY CIRCUIT FOR RING OSCILLATOR

BACKGROUND OF THE INVENTION

The present invention relates to a delay circuit for a ring oscillator, and especially to a delay circuit for a ring oscillator which is capable of realizing CMOS integration, and is appropriate for application to a CMOS integrated PLL (Phase Lock Loop) in which a VCO (Voltage-controlled Oscillator) is realized in the ring oscillator.

In a ring oscillator circuit of a PLL circuit appropriate for a CMOS integrated circuit, a delay circuit for the ring oscillator is used. Generally, such a delay circuit for a ring oscillator has a circuit arrangement of a single input and single output type or a differential input and differential output type, and an amplification circuit of which gain is more than or equal to 1 is used in the delay circuit for the ring oscillator. In recent years, it is required for this delay circuit to be realized by a CMOS circuit having a circuit arrangement appropriate for circuit integration, and that a delay period of time between an input and an output of the circuit can be electronically adjusted for a temperature process variation.

A delay circuit for a ring oscillator for responding to such a requirement is disclosed in IEEE Journal of Solid State Circuits, Vol. No.SC-25, No.6, pp1385–1394, December 1990.

As shown in FIG. 8, the delay circuit for a ring oscillator disclosed in the aforementioned document includes PMOS transistors MP11 and MP12 which are always biased to a triode region by a reference voltage circuit 101, and thereby, an in-phase gain is suppressed to less than or equal to 1 and only a difference signal component generates oscillation. Furthermore, in this known technology, due to a voltage of a VBIAS terminal, a delay period of time, which is a period of time between an input voltage and an output voltage of the said delay circuit, is variable. In this manner, this known technology is formed as a delay circuit for a ring oscillator appropriate for CMOS circuit integration.

Figure 4:
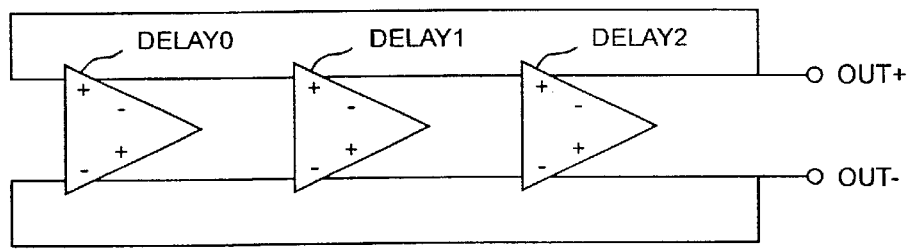
Figure 5:
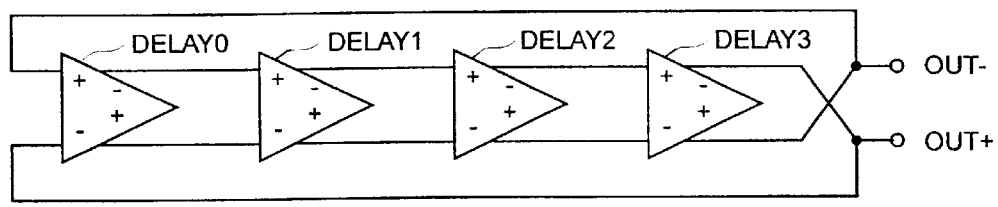

In case that the ring oscillator is constructed by using delay circuits, of which in-phase gain is more than or equal to 1, and as shown in FIG. 4, odd numbers of the delay circuits are used, a loop gain of an in-phase signal component of the ring oscillator becomes more than or equal to 1, and not only an oscillation output due to a differential signal component, but also an oscillation output due to an in-phase signal component are included in an output signal. In case that the ring oscillator is constructed by using delay circuits, of which in-phase gain is more than or equal to 1, and as shown in FIG. 5, even numbers of the delay circuits are used, similarly a loop gain of an in-phase signal component of the ring oscillator becomes to be more than or equal to 1, and in this case, a bistable circuit is formed and an output voltage of the ring oscillator finally becomes any one of voltage condition of a high voltage side VDD or a low voltage side VSS. Usually, since the ring oscillator using a differential input and differential output type delay circuit is designed so as to generate oscillation due to a differential signal component, a loop gain of an in-phase signal component is set to less than or equal to 1, and it is necessary to remove influence of unstabilization of an oscillation output due to the in-phase signal component.

Technology shown in FIG. 8 prevents an in-phase gain from becoming more than or equal to 1 by intentionally increasing conductance between the respective drains and sources of the PMOS transistors MP11 and MP12 which are loads. More particularly, gate voltages of the PMOS transistors MP11 and MP12 are set so that the PMOS transistors MP11 and MP12 which are loads always operate in a triode region. Generally, with regard to conductance between a drain and a source of a MOS transistor, compared with conductance between a drain and a source in a triode region, the conductance between the drain and the source in a saturation region is very small, and in case that the PMOS transistor MP11 and the PMOS transistor MP12 operate in the saturation region out of the triode region, an in-phase gain becomes more than or equal to 1. If a ring oscillator is constructed by such transistors, the ring oscillator having an odd stage arrangement shown in FIG. 4 can have condition in which oscillation occurs due to an in-phase signal component. Furthermore, the circuit of FIG. 8, which is a circuit having a differential input and a differential output, can realize a ring oscillator having an even stage arrangement shown in FIG. 5. However, in case that an in-phase gain of its delay circuit is more than or equal to 1, it becomes a bistable circuit and can have condition in which oscillation does not occur.

If it reaches such a condition, in order to always operate the PMOS transistors in the triode region, a reference voltage circuit for always supplying a constant voltage for a temperature variation and a process variation is necessary for gate voltages of these PMOS transistors, and as a result, a task that a chip area increases is derived.

It is desired that, without using the reference voltage circuit, a differential gain of more than or equal to 1 and an in-phase gain of less than or equal to 1 are easily realized. Moreover, by realizing the differential gain of more than or equal to 1 and the in-phase gain of less than or equal to 1, it is desired to provide a delay circuit for a ring oscillator appropriate for CMOS integration.

SUMMARY OF THE INVENTION

The present invention is made to solve the above-mentioned problems.

Furthermore, the objective of the invention is to provide a delay circuit for a ring oscillator, which can easily realize a differential gain of more than or equal to 1 and an in-phase gain of less than or equal to 1, without using a reference voltage circuit.

Furthermore, the objective of the invention is to provide a delay circuit for a ring oscillator appropriate for CMOS integration by realizing the differential gain of more than or equal to 1 and the in-phase gain of less than or equal to 1.

Means for solving the objectives are described as follows. In technical items in the descriptions, which correspond to the claims, numerals, symbols and so forth are attached and described with parentheses ( ). Although the numerals, symbols and so forth clarify a coincidence or correspondence relation between the technical items corresponding to the claims and technical items in at least one embodiment out of a plurality of embodiments, they are not for showing that the technical items corresponding to the claims are restricted to the technical items in the embodiments.

A delay circuit for a ring oscillator in accordance with the present invention comprises a first electric potential line (VDD), a pair of output lines (2A, 2B), a pair of two first transistors (MP1, MP2) arranged between the first electric potential line (VDD) and the pair of output lines (2A, 2B), respectively, a second electric potential line (5), and a pair of two second transistors (MN1, MN2) arranged between the second electric potential line (5) and the pair of output lines (2A, 2B), respectively, and respective gates of the first transistors (MP1, MP2) are connected to the pair of output lines (2A, 2B), respectively, the two first transistors (MP1, MP2) are connected to each other center-symmetrically, and the two second transistors (MN1, MN2) are connected to each other center-symmetrically, and the delay circuit further comprises a third electric potential line (a ground line of FIG. 2, FIG. 3 or FIG. 7 or VDD of FIG. 6), and the pair of output lines (2A, 2B) are connected to the third electric potential line. (a ground line of FIG. 2, FIG. 3 or FIG. 7 or VDD of FIG. 6). Such a circuit can easily realize a differential gain of more than or equal to 1 and an in-phase gain of less than or equal to 1.

It is preferable that, if the first transistors (MP1, MP2) are PMOS transistors, the second transistors (MN1, MN2) are NMOS transistors, and if the first transistors (MP1, MP2) are MMOS transistors, the second transistors are PMOS transistors.

Moreover, it is preferable to provide a pair of third transistors (MP3, MP4) arranged between the pair of output lines (2A, 2B) and the first electric potential line. In this case, gates of the first transistors (MP1, MP2) are center-symmetrically connected to gates of the third transistors (MP3, MP4), respectively.

Furthermore, it is also preferable to provide a pair of fourth transistors (MN3, MN4) arranged between the pair of output lines (2A, 2B) and the third electric potential line. In this case, gates of the fourth transistors (MN3, MN4) are connected to the output lines (2A, 2B), respectively.

Input voltages applied to gates of the two second transistors (MN1, MN2), respectively, are represented by V1 and V2, an in-phase input voltage with respect to the input voltages V1 and V2 is represented by VIQ, a differential input voltage included as a form of an input difference between the two inputs V1 and V2 is represented by $\Delta$VI, two output voltages which appear in the output lines (2A, 2B) are represented by Vo1 and Vo2, an in-phase output voltage which is commonly included in the output voltages Vo1 and Vo2 is represented by VOQ, a differential output voltage included as a form of an output difference between the output voltages Vo1 and Vo2 is included is represented by $\Delta$VO, transconductance of the first transistors (MP1, MP2) is represented by Gmp, transconductance of the second transistors (MN1, MN2) is represented by Gmn, transconductance between the output lines (2A, 2B) and the third electric potential line is represented by Gm.

If conductance as a design constant is set to Gds, an in-phase gain VOQ/VIQ of the said circuit is obtained by the following equation: VOQ/VIQ=-(Gmn*Gds/2)/{(Gmp+Gm)*(Gmn+Gds/2)}. If the design constant is defined so as to be Gmn>>Gds/2, Gmn is eliminated in this equation, and an approximated equation: VOQ/VIQ=-(Gds/2)/(Gmp+Gm) is obtained. It is possible to further appropriately set the design constant Gds so that this in-phase gain becomes to be small enough. In this case, a differential gain $\Delta$VO/$\Delta$VI is expressed by the following equation: $\Delta$VO/$\Delta$VI=Gmn/(Gmp-Gm). Values of the parameters Gmn, Gmp and Gm are set so as to be Gmn>(Gmp-Gm). Moreover, the circuit comprises a forth electric potential line (VSS), and a bias transistor (MNB) arranged between the fourth electric potential line (VSS) and the second electric potential line, and conductance between a drain and a source of the bias transistor (MNB) coincides with the design constant Gds. Such a circuit surely realizes a differential gain of more than or equal to 1 and an in-phase gain of less than or equal to 1.

BRIEF DESCRIPTION OF THE INVENTION

Figure 1:
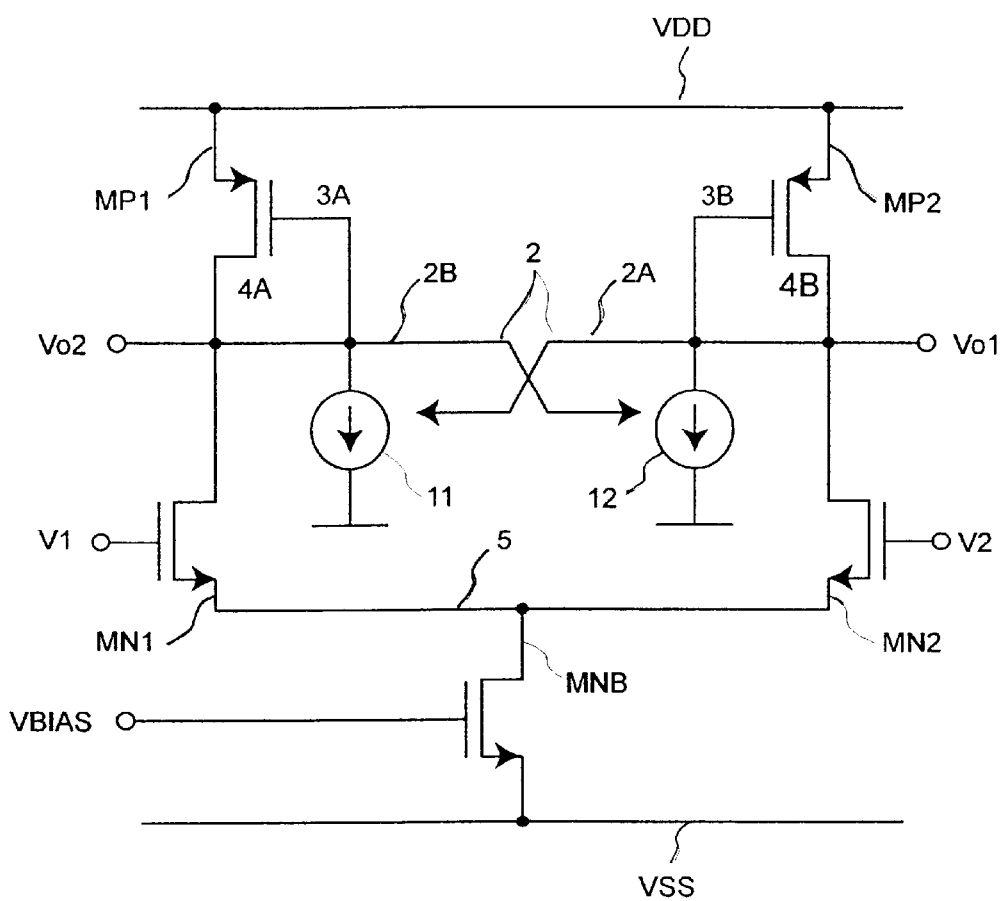
Figure 2:
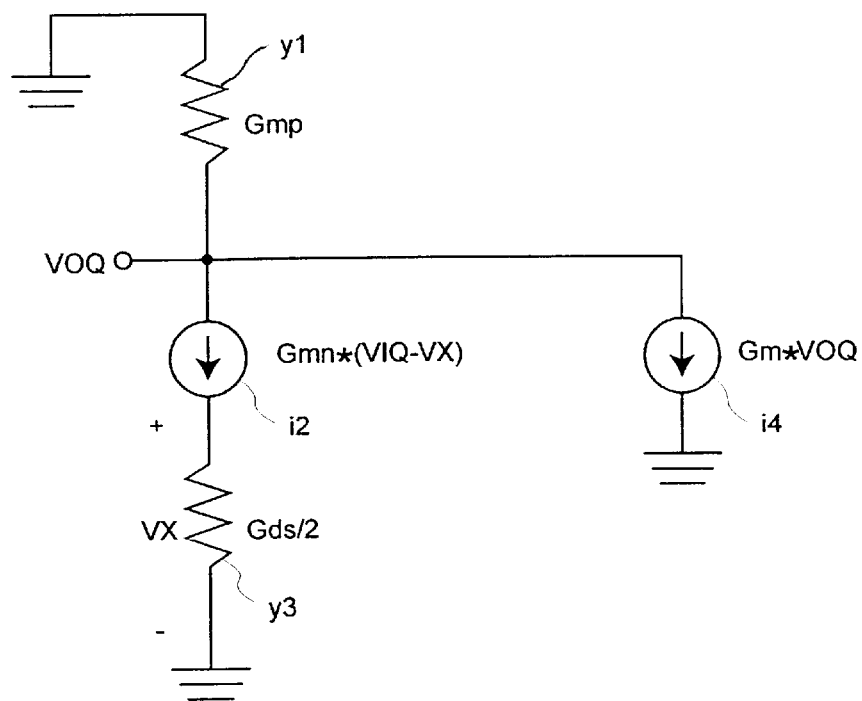
Figure 3:
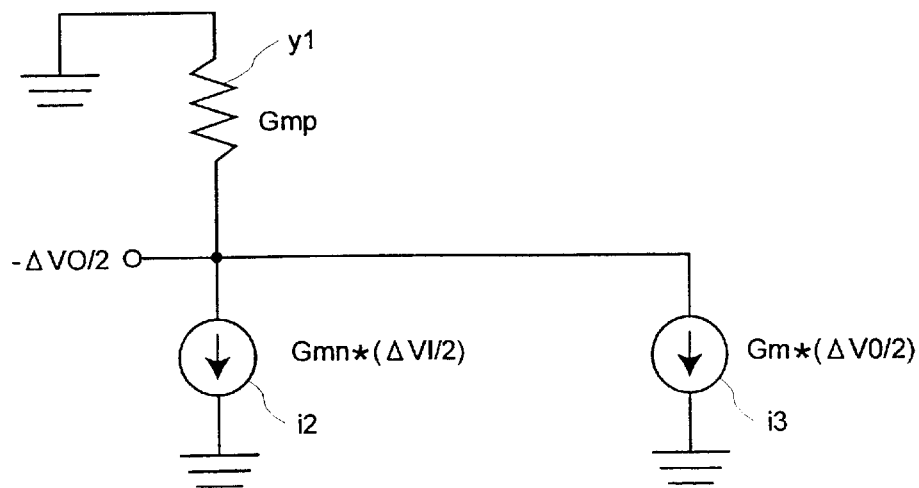
Figure 6:
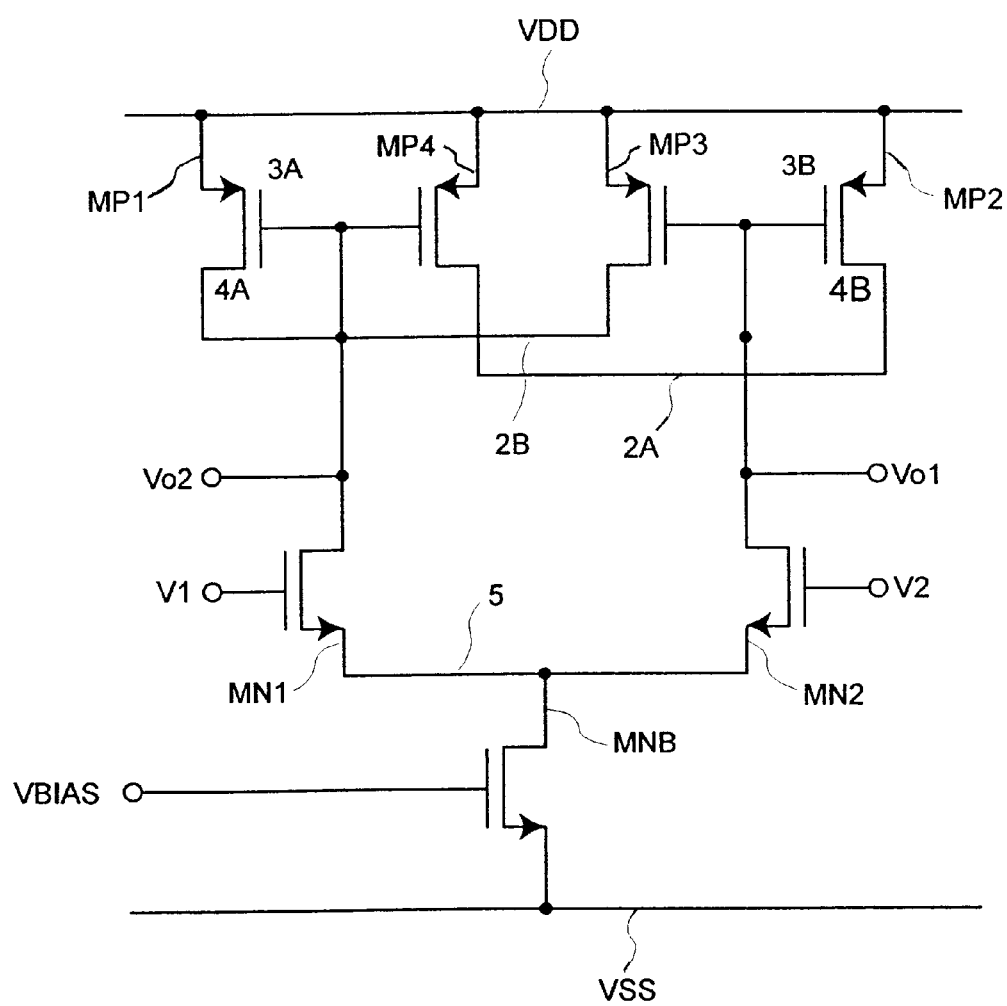

This and other objects, features, and advantages of the present invention will become more apparent upon a reading of the following detailed description and drawings, in which:

FIG. 1 is a circuit diagram showing an embodiment of a delay circuit for a ring oscillator in accordance with the present invention, FIG. 2 is a circuit diagram showing an equivalent circuit with regard to an in-phase signal component of the circuit of FIG. 1, FIG. 3 is a circuit diagram showing an equivalent circuit with regard to a differential signal component of the circuit of FIG. 1, FIG. 4 is a circuit diagram showing a known ring oscillator, FIG. 5 is a circuit diagram showing another known ring oscillator, FIG. 6 is a circuit diagram showing other embodiment of a delay circuit for a ring oscillator in accordance with the present invention.

Figure 7:
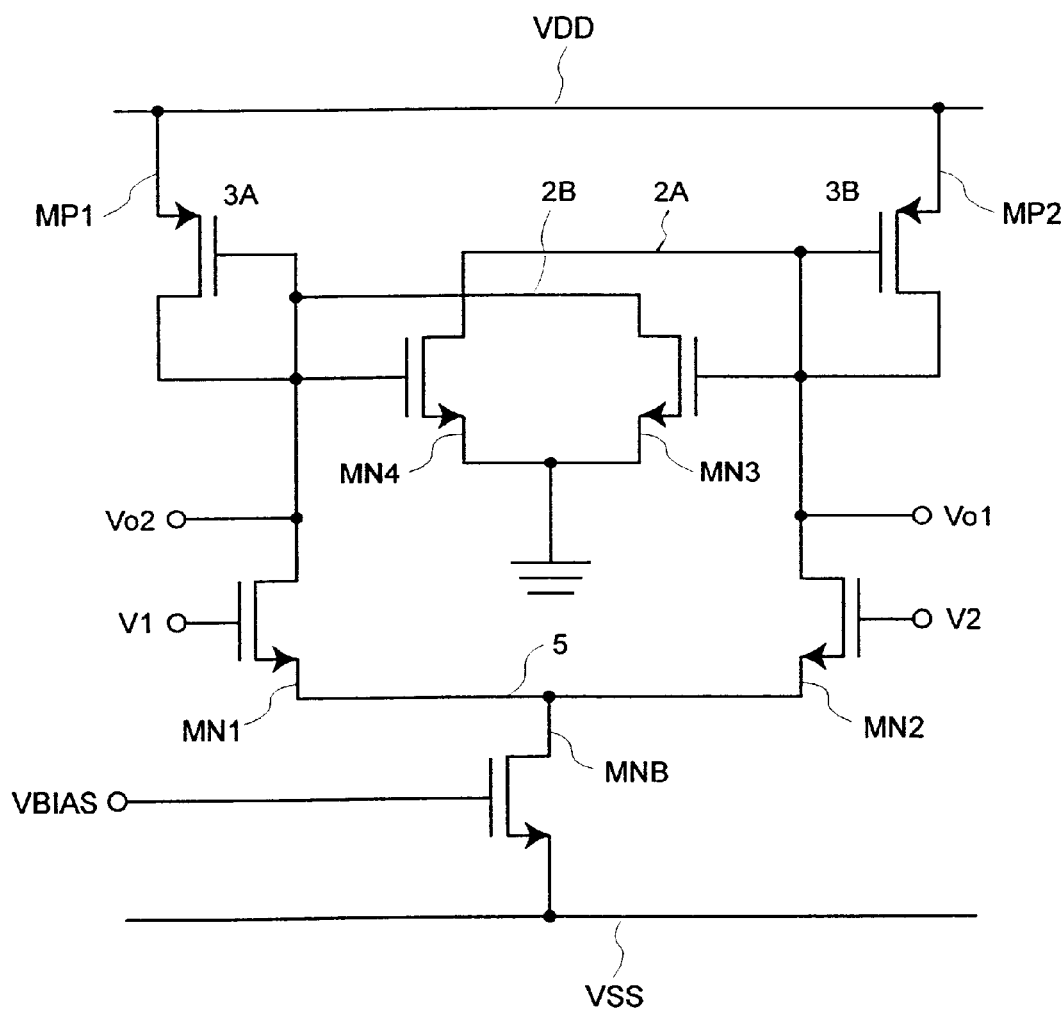

FIG. 7 is a circuit diagram showing further other embodiment of a delay circuit for a ring oscillator in accordance with the present invention and FIG. 8 is a circuit diagram showing a conventional delay circuit for a ring oscillator.

DESCRIPTION OF THE EMBODIMENTS

In accordance with drawings, in an embodiment of a delay circuit for a ring oscillator according to the present invention, a source coupling paired circuit is provided. In the source coupling paired circuit, a first NMOS transistor MN1 and a second NMOS transistor MN2 are coupled with their sources paired. An NMOS transistor MNB for a bias current source is connected to the first NMOS transistor MN1 and the second NMOS transistor MN2. The NMOS transistor MNB for a bias current source is a current source for supplying a bias current to the first NMOS transistor MN1 and the second NMOS transistor MN2.

A first PMOS transistor MP1 and a second PMOS transistor MP2 which act as output loads are connected to an output line 2. The first PMOS transistor MP1 and the second PMOS transistor MP2 are arranged between a high electric potential side power supply line VDD and the output line 2.

The output line 2 is formed of a second output line 2B and a first output line 2A. The second output line 2B is short-circuited to a first gate 3A of the first PMOS transistor MP1, and the first output line 2A is short-circuited to a second gate 3B of the second PMOS transistor MP2. In the first PMOS transistor MP1 and the second PMOS transistor MP2, their respective first gate 3A and second gate 3B are short-circuited to their respective drains 4A and 4B.

A first voltage controlling current source I1 and a second voltage controlling current source I2 are connected to the output line 2. The first voltage controlling current source I1 and the second voltage controlling current source I2 are connected to an output voltage node with an arbitrary fixed electric potential, and are controlled by an output voltage. A bias power source VBIAS is connected to a gate of the NMOS transistor MNB for a bias current source.

The bias power source VBIAS applies a bias to the NMOS transistor MNB for a bias current source so as to be in a saturation region. The NMOS transistor MNB for a bias current source is arranged between a pair joint line 5 for joining the first NMOS transistor MN1 to the second NMOS transistor MN2 in pairs, and a low electric potential side power supply line VSS.

A first input voltage V1 and a second input voltage V2 are input to a gate of the first NMOS transistor MN1 and a gate of the second NMOS transistor MN2, respectively. In case that the first NMOS transistor MN1, the second NMOS transistor MN2 and the NMOS transistor MNB for a bias current source are in a saturation region, and electric characteristics of the first NMOS transistor MN1 and the second NMOS transistor MN2 are the same as each other, and electric characteristics of the first PMOS transistor MP1 and the second PMOS transistor MP2 are the same as each other, one set of the right and left first NMOS transistor MN1 and second NMOS transistor MN2, one set of right and left first PMOS transistor MP1 and second PMOS transistor MP2, and one set of right and left first voltage controlling current source I1 and second voltage controlling current source I2 operate symmetrically, respectively, for an in-phase signal input which is a signal commonly included in the first input voltage V1 and the second input voltage V2. The said delay circuit which operates symmetrically in this manner can be expressed by only a circuit on one side shown in FIG. 2 in which the delay circuit is divided into two with respect to a symmetrical center line.

If an in-phase signal component is focussed, the circuit shown In FIG. 2 corresponds to an equivalent circuit that is equivalent to one side of the circuit of FIG. 1. In the equivalent circuit of FIG. 2, transconductance of the first NMOS transistor MN1 is represented by Gnm, transconductance of the first PMOS transistor MP1 is represented by Gmp, transconductance of the first voltage controlling current source I1 is represented by Gm, conductance between a drain and a source of the NMOS transistor MNB for a bias current source is represented by Gds, and a conductance component for an in-phase signal component is represented by y3. With regard to the conductance component for the in-phase signal component, since only conductance which is a half of the conductance between a drain and a source of the NMOS transistor MNB for a bias current source contributes to the in-phase signal component, y3=Gds/2.

Similarly, in case that the first NMOS transistor MN1, the second NMOS transistor MN2 and the NMOS transistor MNB for a bias current source are in a saturation region, and electric characteristics of the first NMOS transistor MN1 and the second NMOS transistor MN2 are the same as each other, and electric characteristics of the first PMOS transistor MP1 and the second PMOS transistor MP2 are the same as each other, one set of the right and left first NMOS transistor MN1 and second NMOS transistor MN2, one set of right and left first PMOS transistor MP1 and second PMOS transistor MP2, and one set of right and left first voltage controlling current source I1 and second voltage controlling current source I2 operate in an opposite direction, respectively, for a differential signal input which is a signal component commonly included as an input difference between the first input voltage V1 and the second input voltage V2. With regard to the first NMOS transistor MN1 and the second NMOS transistor MN2 which operate in an opposite direction in this manner, it can be considered that their respective source electric potentials are equivalently a ground electric potential, and the first NMOS transistor MN1 and the second NMOS transistor MN2 can be expressed by only a circuit on one side shown in FIG. 3.

If a differential signal component is focussed, the circuit shown in FIG. 3 corresponds to an equivalent circuit that is equivalent to one side of the circuit of FIG. 1. Same as the equivalent circuit of FIG. 2, also in the equivalent circuit of FIG. 3, transconductance of the first NMOS transistor MN1 is represented by the above-mentioned Gnm, transconductance of the first PMOS transistor MP1 is represented by the above-mentioned Gmp, and transconductance of the first voltage controlling current source I1 is represented by the above-mentioned Gm.

The first PMOS transistor MP1 always operates in a saturation region since its gate and drain are short-circuited to each other, and its conductance y1 is equal to the transconductance Gmp. An in-phase input voltage included in the two inputs V1 and V2 is represented by VIQ, and a differential input voltage that is a signal component included as a form of an input difference of the two inputs V1 and V2 is represented by $\Delta VI$, and the in-phase input voltage and the differential input voltage are defined by the following equations:

$$\text{In-phase input voltage: } VIQ=(V1+V2)/2, \tag{1}$$

$$\text{Differential input voltage: } \Delta VI=(V1-V2). \tag{2}$$

Similarly, an in-phase output voltage commonly included in the two outputs Vo1 and Vo2 is represented by VOQ, and a differential output voltage that is a signal component included as a form of an output difference of the two outputs Vo1 and Vo2 is represented by $\Delta VO$, and the in-phase output voltage and the differential output voltage are defined by the following equations:

$$\text{In-phase output voltage: } VOQ=(Vo1+Vo2)/2, \tag{3}$$

$$\text{Differential output voltage: } \Delta VO=(Vo1-Vo2). \tag{4}$$

In accordance with such definitions, the input voltages V1 and V2, and the output voltages Vo1 and Vo2 are expressed by the following equations, respectively:

$$V1=\Delta VI/2+VIQ, \tag{5}$$

$$V2=-\Delta VI/2+VIQ, \tag{6}$$

$$Vo1=\Delta VO/2+VOQ, \tag{7}$$

$$Vo2=-\Delta VI/2+VOQ. \tag{8}$$

In the equivalent circuit of an in-phase component, which is shown in FIG. 2, a voltage across the conductance y3 is expressed by VX, VX is expressed by the following equation:

$$VX=Gmn*VIQ/(Gmn+Gds/2) \tag{9}$$

With respect to an output node where the in-phase output voltage VOQ appears, the following equation is established:

$$Gmn*(VIQ-VX)+Gmp*VOQ+Gm*VOQ=0. \tag{10}$$

If VOQ/VIQ is assumed for an in-phase gain, from the equation (10), $$VOQ/VIQ=-(Gmn*Gds/2)/\{(Gmp+Gm)*(Gmn+Gds/2)\}. \tag{11}$$

Generally, with regard to the MOS transistor which is biased in a saturation region, transconductance is large enough compared with the conductance between a drain and a source. Moreover, since the NMOS transistor MNB for a bias current source acts as a current source, usually the gate voltage VBIAS is set so that the conductance between a drain and a source becomes to be small enough. Accordingly, it can be considered that Gmn>>Gds/2 is established. The equation (11) is simplified as the following equation:

$$VOQ/VIQ=-(Gds/2)/(Gmp+Gm)<<1. \tag{12}$$

As such, the gain is fully smaller than 1. Similarly, in the equivalent circuit of a differential signal component, which is shown in FIG. 3, with respect to an output contact where the differential output voltage ΔVO appears, the following equation is established:

$$Gmn*(\Delta VI/2)+Gmp*(-\Delta VO/2)+Gm*(\Delta VO/2)=0. \quad (13)$$

With regard to a differential gain ΔVO/ΔVI, $$\Delta VO/\Delta VI=Gmn/(Gmp-Gm). \quad (14).$$

As apparent from the equation (14), by selecting parameters so as to be $$Gmn>(Gmp-Gm), \quad (15)$$

it is possible to make the differential gain to be more than or equal to 1.

By setting the transconductance Gmp of the first PMOS transistor MP1 and the second PMOS transistor MP2 to a value close to the transconductance Gm of the voltage controlling current sources I1 and I2, it is possible to arbitrarily set the differential gain to be a value more than or equal to 1. Generally, with regard to a MOS transistor, it is possible to set its transconductance to an arbitrary value by adjusting a channel width and a channel length which are shapes of its gate. Accordingly, by adjusting the gate shape of the NMOS transistors MN1 and MN2 and the PMOS transistors MP1 and MP2, a designer can easily obtain a relation of the equation (15).

In the embodiment shown in FIG. 1, it is possible to replace the NMOS transistors MN1, MN2 and MNB by PMOS transistors, respectively, and to replace the PMOS transistors MP1 and MP2 by NMOS transistors, respectively. In this case, the voltage controlling current sources I1 and I2 become to be an injection current source type for a voltage output node.

If the above-mentioned delay circuit for the ring oscillator in accordance with the present invention is used, in case of constructing a ring oscillator having odd stages by means of DELAY0, DELAY1 and DELAY2 that are three delay circuits shown in FIG. 4, since It is possible to set a loop gain to more than or equal to 1 for a differential signal component and less than or equal to 1 for an in-phase signal component, oscillation in the in-phase signal component can be suppressed, and it is possible to realize a ring oscillator which generates oscillation only for the differential signal component.

Similarly, in case of constructing a ring oscillator having even stages by means of DELAY0, DELAY1, DELAY2 and DELAY3 that are four delay circuits shown in FIG. 5, since, like the above-mentioned ring oscillator having the odd stages, it is possible to set a loop gain to more than or equal to 1 for a differential signal component and less than or equal to 1 for an in-phase signal component, bistable condition for the in-phase signal component can be suppressed, and it is possible to realize a ring oscillator which generates oscillation only for the differential signal component. With regard to the number of the delay circuits, it is possible to increase the number arbitrarily, without restricting it to three or four.

Like the delay circuit for the ring oscillator, which is realized in the prior art, in the delay circuit for the ring oscillator in accordance with the present invention, by adjusting a bias of the circuit by means of a voltage of the VBIAS terminal, it is possible to make a delay period of time to be variable, which is response period of time of its input voltage and output voltage. Since an oscillating frequency of the ring oscillator is determined by a delay period of time which the delay circuit has and the number of the delay circuits which exist in a loop, the ring oscillator which is realized by using the delay circuit in accordance with the present invention can electronically control the oscillating frequency. Accordingly, the delay circuit for the ring oscillator in accordance with the present invention is suitable for application to a VCO that is a basic constitution element of a PLL. Since the principle of the ring oscillator using the delay circuit and the application of the ring oscillator to the PLL are well-known in the art, the descriptions thereof are omitted.

FIG. 6 shows a circuit arrangement in accordance with a second embodiment of the present invention. With regard to an inter-connection relation between the first NMOS transistor MN1, the second NMOS transistor MN2, the first PMOS transistor MP1 and the second PMOS transistor MP2, a connection relation between the active points of the input voltages V1 and V2 and the terminal points of the output voltages Vo1 and Vo2, and the first NMOS transistor MN1, the second NMOS transistor MN2, the first PMOS transistor MP1 and the second PMOS transistor MP2, and a wiring relation between the high electric potential side power supply line VDD, the output line 2, the pair joint line 5 and the low electric potential side power supply line VSS for the first NMOS transistor MN1, the second NMOS transistor MN2, the first PMOS transistor MP1 and the second PMOS transistor MP2, these relations are totally the same as those in FIG. 1.

A second output line 2B is connected to the high electric potential side power supply line VDD through a third PMOS transistor MP3. A first output line 2A is connected to the high electric potential side power supply line VDD through a fourth PMOS transistor MP4. A gate of the third PMOS transistor MP3 is connected to a gate and a drain of the second PMOS transistor MP2. A gate of the fourth PMOS transistor MP4 is connected to a gate and a drain of the first PMOS transistor MP1. The third and fourth PMOS transistors MP3 and MP4 are voltage controlling current sources for detecting an output voltage and converting it into a current. A VBIAS is the same as that of FIG. 1 in the sense that it is a bias power supply line for controlling a current of the NMOS transistor MNB for a bias current source.

By replacing the voltage controlling current source I1 for detecting the output voltage Vo1 and converting it into a current, which is shown in FIG. 1, by the third PMOS transistor MP3, and replacing the voltage controlling current source I2 for detecting the output voltage Vo2 and converting it into a current, which is shown in FIG. 1, by the fourth PMOS transistor MP4, an embodiment shown in FIG. 6 is realized.

With regard to the circuit shown in FIG. 6, a channel width and a channel length of the first NMOS transistor MN1 and the second NMOS transistor MN2 are set to be the same as each other in both transistors so that both transistors obtain the same electric characteristic. Similarly, a channel width and a channel length of the first PMOS transistor MP1 and the second PMOS transistor MP2 are set to be the same as each other in both transistors so that both transistors obtain the same electric characteristic. Furthermore, and similarly, a channel width and a channel length of the third PMOS transistor MP3 and the fourth PMOS transistor MP4 are set to be the same as each other in both transistors so that both transistors obtain the same electric characteristic.

In case that the transistors MN1, MN2 and MNB are in a saturation region, respectively, one set of the right and left first NMOS transistor MN1 and second NMOS transistor MN2, one set of right and left first PMOS transistor MP1 and second PMOS transistor MP2, and one set of right and left third PMOS transistor MP3 and fourth PMOS transistor MP4 operate symmetrically, respectively, for an in-phase signal input which is a signal commonly included in the first input voltage V1 and the second input voltage V2. The said delay circuit which operates symmetrically in this manner is a circuit same as only a circuit on one side shown in FIG. 2 in which the delay circuit is divided into two with respect to a symmetrical center line.

Accordingly, with regard to FIG. 2, Gmn can be replaced by transconductance of the transistor MN1 in FIG. 6, Gmp can be replaced by transconductance of the transistor MP1 in FIG. 6, Gm can be replaced by transconductance of the third PMOS transistor MP3 in FIG. 6, and Gds can be replaced by conductance between a drain and a source of the NMOS transistor MNB for a bias current source in FIG. 6, respectively. On the other hand, for a differential signal input which is a signal component included as a difference between two inputs, in FIG. 6, since one set of the right and left transistors MN1 and MN2, one set of right and left transistors MP1 and MP2, and one set of right and left transistors MP3 and MP4 operate in an opposite direction, respectively, it can be considered that source electric potentials of the first NMOS transistor MN1 and the second NMOS transistor MN2 of FIG. 6 are equivalently grounds, and for the differential signal component of the circuit in the embodiment shown in FIG. 6, the equivalent circuit on one side is the same as the above-mentioned equivalent circuit on one side shown in FIG. 3. Accordingly, with regard to FIG. 3, Gmn can be replaced by transconductance of the transistor MN1 in FIG. 6, Gmp can be replaced by transconductance of the first PMOS transistor MP1 in FIG. 6, and Gm can be replaced by transconductance of the third PMOS transistor MP3 in FIG. 6, respectively.

With regard to the circuit shown in FIG. 6, if the respective channel widths and channel lengths of the transistors MN1, MN2, MP1, MP2, MP3 and MP4 are selected so that the equation (15) is established, it is possible to obtain a characteristic same as that of the delay circuit for the ring oscillator shown in FIG. 1, and an in-phase gain of FIG. 6 is given by the equation (12) and a differential gain of FIG. 6 is given by the equation (14), respectively.

In the embodiment shown in FIG. 6, as mentioned above, it is possible to construct the PMOS transistors MP1, MP2, MP3 and MP4 by NMOS transistors, respectively, and to construct the NMOS transistors MN1, MN2 and MNB by PMOS transistors, respectively.

FIG. 7 shows a circuit arrangement in accordance with a third embodiment of the present invention. With regard to an inter-connection relation between the first NMOS transistor MN1, the second NMOS transistor MN2, the first PMOS transistor MP1 and the second PMOS transistor MP2, a connection relation between the active points of the input voltages V1 and V2 and the terminal points of the output voltages Vo1 and Vo2, and the first NMOS transistor MN1, the second NMOS transistor MN2, the first PMOS transistor MP1 and the second PMOS transistor MP2, and a wiring relation between the high electric potential side power supply line VDD, the output line 2, the pair joint line 5 and the low electric potential side power supply line VSS for the first NMOS transistor MN1, the second NMOS transistor MN2, the first PMOS transistor MP1 and the second PMOS transistor MP2, these relations are totally the same as those in FIG. 1.

A second output line 2B is connected to a ground line through a third NMOS transistor MN3. A first output line 2A is connected to the ground line through a fourth NMOS transistor NM4. A gate of the third NMOS transistor MN3 is connected to a gate and a drain of the second PMOS transistor MP2. A gate of the fourth NMOS transistor MN4 is connected to a gate and a drain of the first PMOS transistor MP1. The third and fourth NMOS transistors MN3 and MN4 are voltage controlling current sources for detecting an output voltage and converting it into a current. A VBIAS is the same as that of FIG. 1 in the sense that it is a bias power supply line for controlling a current of the NMOS transistor MNB for a bias current source.

By replacing the voltage controlling current source I1 for detecting the output voltage Vo1 and converting it into a current, which is shown in FIG. 1, by the third NMOS transistor MN3, and replacing the voltage controlling current source I2 for detecting the output voltage Vo2 and converting it into a current, which is shown in FIG. 1, by the fourth NMOS transistor MN4, an embodiment shown in FIG. 7 is realized.

With regard to the circuit shown in FIG. 7, a channel width and a channel length of the first NMOS transistor MN1 and the second NMOS transistor MN2 are set to be the same as each other in both transistors so that both transistors obtain the same electric characteristic. Similarly, a channel width and a channel length of the first PMOS transistor MP1 and the second PMOS transistor MP2 are set to be the same as each other in both transistors so that both transistors obtain the same electric characteristic. Furthermore, similarly, a channel width and a channel length of the third NMOS transistor MN3 and the fourth NMOS transistor MN4 are set to be the same as each other in both transistors so that both transistors obtain the same electric characteristic.

In case that the transistors MN1, MN2 and MNB are in a saturation region, respectively, one set of the right and left first NMOS transistor MN1 and second NMOS transistor MN2, one set of right and left first PMOS transistor MP1 and second PMOS transistor MP2, and one set of right and left third NMOS transistor MN3 and fourth NMOS transistor MN4 operate symmetrically, respectively, for an in-phase signal input which is a signal commonly included in the first input voltage V1 and the second input voltage V2. The said delay circuit which operates symmetrically in this manner is a circuit same as only a circuit on one side shown in FIG. 2 in which the delay circuit is divided into two with respect to a symmetrical center line.

Accordingly, with regard to FIG. 2, Gmn can be replaced by transconductance of the transistor MN1 in FIG. 7, Gmp can be replaced by transconductance of the transistor MP1 in FIG. 7, Gm can be replaced by transconductance of the third NMOS transistor MN3 in FIG. 7, and Gds can be replaced by conductance between a drain and a source of the NMOS transistor MNB for a bias current source in FIG. 7, respectively. On the other hand, for a differential signal input which is a signal component included as a difference between two inputs, in FIG. 7, since one set of the right and left transistors MN1 and MN2, one set of right and left transistors MP1 and MP2, and one set of right and left transistors MN3 and MN4 operate in an opposite direction, respectively, it can be considered that source electric potentials of the first NMOS transistor MN1 and the second NMOS transistor MN2 of FIG. 7 are equivalently grounds, and for the differential signal component of the circuit in the embodiment shown in FIG. 7, the equivalent circuit on one side is the same as the above-mentioned equivalent circuit on one side shown in FIG. 3. Accordingly, with regard to FIG. 3, Gmn can be replaced by transconductance of the transistor MN1 in FIG. 7, Gmp can be replaced by transconductance of the first PMOS transistor MP1 in FIG. 7, and Gm can be replaced by transconductance of the third NMOS transistor MN3 in FIG. 7, respectively.

With regard to the circuit shown in FIG. 7, if the respective channel widths and channel lengths of the transistors MN1, MN2, MP1, MP2, MN3 and MN4 are selected so that the equation (15) is established, it is possible to obtain a characteristic same as that of the delay circuit for the ring oscillator shown in FIG. 1, and an in-phase gain of FIG. 7 is given by the equation (12) and a differential gain of FIG. 7 is given by the equation (14), respectively.

In the embodiment shown in FIG. 7, as mentioned above, it is possible to construct the NMOS transistors MN1, MN2, MN3, MN4 and MNB by PMOS transistors, respectively, and to construct the PMOS transistors MP1 and MP2 by NMOS transistors, respectively.

The delay circuit for the ring oscillator in accordance with the present invention easily realizes a differential gain of more than or equal to 1 and an in-phase gain of less than or equal to 1.

What is claimed is:

1. A delay circuit for a ring oscillator, comprising:
   a first electric potential line;
   a pair of output lines;
   a pair of first transistors arranged between said first electric potential line and said pair of output lines, respectively;
   a second electric potential line; and
   a pair of second transistors arranged between said second electric potential line and said pair of output lines, respectively;
   wherein gates of said first transistors are connected to said pair of output lines, respectively, said first transistors are connected to each other center-symmetrically, and said second transistors are connected to each other center-symmetrically,
   wherein said delay circuit further comprises:
      a third electric potential line, said pair of output lines being connected to said third electric potential line,
      a pair of third transistors arranged between said pair of output lines and said first electric potential line, and gates of said first transistors are center-symmetrically connected to gates of said third transistors.

2. A delay circuit for a ring oscillator, comprising:
   a first electric potential line;
   a pair of output lines;
   a pair of first transistors arranged between said first electric potential line and said pair of output lines, respectively;
   a second electric potential line; and
   a pair of second transistors arranged between said second electric potential line and said pair of output lines, respectively;
   wherein gates of said first transistors are connected to said pair of output lines, respectively, said first transistors are connected to each other center-symmetrically, and said second transistors are connected to each other center-symmetrically,
   wherein said delay circuit further comprises:
      a third electric potential line, said pair of output lines being connected to said third electric potential line, and
      a pair of third transistors arranged between said pair of output lines and said third electric potential line, where gates of said third transistors are connected to said output lines, respectively.

3. A delay circuit for a ring oscillator comprising:
   a first electric potential line;
   a pair of output lines;
   a pair of first transistors arranged between said first electric potential line and said pair of output lines, respectively;
   a second electric potential line;
   a pair of second transistors arranged between said second electric potential line and said pair of output lines, respectively; and
   a third electric potential line,
   wherein:
      gates of said first transistors are connected to said pair of output lines, respectively,
      said first transistors are connected to each other center-symmetrically, and said second transistors are connected to each other center-symmetrically,
      said pair of output lines are connected to said third electric potential line, and
      wherein when input voltages applied to gates of said second transistors, respectively, are represented by V1 and V2, an in-phase input voltage with respect to said input voltages V1 and V2 is represented by VIQ, a differential input voltage included as a form of an input difference between the two inputs V1 and V2 is represented by $\Delta$VI, two output voltages which appear in said output lines are represented by Vo1 and Vo2, and in-phase output voltage which is commonly included in said output voltages Vo1 and Vo2 is represented by VOQ, a differential output voltage included as a form of an output difference between said output voltages Vo1 and Vo2 is represented by $\Delta$VO, transconductance of said first transistors is represented by Gmp, transconductance of said second transistors is represented by Gmn, transconductance between said output lines and said third electric potential line is represented by Gm, and conductance as a design constant is set to Gds, an in-phase gain VOQ/VIQ of said delay circuit is obtained by the following equation:

$$VOQ/VIQ = -(Gmn*Gds/2)/\{(Gmp+Gm)*(Gmn+Gds/2)\},$$

said design constant is defined so as to be Gmn>>Gds/2, said equation is re-expressed with a good approximation, when Gmn is eliminated, by means of the following equation:

$$VOQ/VIQ = -(Gds/2)/(Gmp+Gm),$$

and said design constant Gds is further appropriately set so that said in-phase gain becomes small enough.

4. A delay circuit for a ring oscillator according to claim 3,
   wherein said delay circuit further comprises:
      a forth electric potential line; and
      a bias transistor arranged between said fourth electric potential line and said second electric potential line, conductance between a drain and a source of said bias transistor is said design constant Gds.

5. A delay circuit for a ring oscillator according to claim 3,
   characterized in that a differential gain $\Delta$VO/$\Delta$VI is expressed by the following equation:

$$\Delta VO/\Delta VI = Gmn/(Gmp-Gm),$$

and
   values of the parameters Gmn, Gmp and Gm are set so as to be Gmn>(Gmp−Gm).

6. A delay circuit for a ring oscillator according to claim 5,
wherein said delay circuit further comprises:
a fourth electric potential line; and
a bias transistor arranged between said fourth electric potential line and said second electric potential line, conductance between a drain and a source of said bias transistor is said design constant Gds.

7. A delay circuit for a ring oscillator, comprising:
a first electric potential line;
a pair of output lines;
a pair of first transistors arranged between said first electric potential line and said pair of output lines, respectively;
a second electric potential line;
a pair of second transistors arranged between said second electric potential line and said pair of output lines, respectively; and
a third electric potential line,
wherein:
gates of said first transistors are connected to said pair of output lines, respectively,
said first transistors are connected to each other center-symmetrically, and said second transistors are connected to each other center-symmetrically,
said pair of output lines are connected to said third electric potential line, and
wherein if said first transistors are PMOS transistors, said second transistors are NMOS transistors, and if said first transistors are NMOS transistors, the second transistors are PMOS transistors, and
wherein when input voltages applied to gates of said second transistors, respectively, are represented by V1 and V2, an in-phase input voltage with respect to said input voltages V1 and V2 is represented by VIQ, a differential input voltage included as a form of an input difference between the two inputs V1 and V2 is represented by ΔVI, two output voltages which appear in said output lines are represented by Vo1 and Vo2, and in-phase output voltage which is commonly included in said output voltages Vo1 and Vo2 is represented by VOQ, a differential output voltage included as a form of an output difference between said output voltages Vo1 and Vo2 is represented by ΔVO, transconductance of said first transistors is represented by Gmp, transconductance of said second transistors is represented by Gmn, transconductance between said output lines and said third electric potential line is represented by Gm, and conductance as a design constant is set to Gds, an in-phase gain VOQ/VIQ of said delay circuit is obtained by the following equation:

$$VOQ/VIQ=-(Gmn*Gds/2)/\{(Gmp+Gm)*(Gmn+Gds/2)\},$$

said design constant is defined so as to be Gmn>>Gds/2, said equation is re-expressed with a good approximation, when Gmn is eliminated, by means of the following equation:

$$VOQ/VIQ=-(Gds/2)/(Gmp+Gm),$$

and said design constant Gds is further appropriately set so that said in-phase gain becomes small enough.

8. A delay circuit for a ring oscillator according to claim 7,
characterized in that a differential gain ΔVO/ΔVI is expressed by the following equation:

$$\Delta VO/\Delta VI=Gmn/(Gmp-Gm),$$

and
values of the parameters Gmn, Gmp and Gm are set so as to be Gmn>(Gmp-Gm).

9. A delay circuit for a ring oscillator according to claim 8,
wherein said delay circuit further comprises:
a fourth electric potential line; and
a bias transistor arranged between said fourth electric potential line and said second electric potential line, conductance between a drain and a source of said bias transistor is said design constant Gds.

10. A delay circuit for a ring oscillator, comprising:
a first electric potential line;
a pair of output lines;
a pair of first transistors arranged between said first electric potential line and said pair of output lines, respectively;
a second electric potential line; and
a pair of second transistors arranged between said second electric potential line and said pair of output lines, respectively,
wherein respective gates of said first transistors are connected to said pair of output lines, respectively,
said first transistors are connected to each other center-symmetrically, and said second transistors are connected to each other center-symmetrically,
the delay circuit further comprising a third electric potential line,
wherein said pair of output lines are connected to said third electric potential line,
wherein if the first transistors are PMOS transistors, the second transistors are NMOS transistors, and if the first transistors are MMOS transistors, the second transistors are PMOS transistors,
and further comprises a pair of third transistors arranged between said pair of output lines and said first electric potential line, and
gates of said first transistors are center-symmetrically connected to gates of said third transistors.

11. A delay circuit for a ring oscillator, comprising:
a first electric potential line;
a pair of output lines;
a pair of first transistors arranged between said first electric potential line and said pair of output lines, respectively;
a second electric potential line;
a pair of second transistors arranged between said second electric potential line and said pair of output lines, respectively; and
a third electric potential line,
wherein gates of said first transistors are connected to said pair of output lines, respectively,
said first transistors are connected to each other center-symmetrically, and said second transistors are connected to each other center-symmetrically,
said pair of output lines are connected to said third electric potential line, and
if said first transistors are PMOS transistors, said second transistors are NMOS transistors, and if said first transistors are NMOS transistors, said second transistors are PMOS transistors, said delay circuit further comprising a pair of third transistors arranged between said pair of output lines and said first electric potential line, and gates of said first transistors are center-symmetrically connected to gates of said third transistors, wherein when input voltages applied to gates of said second transistors, respectively, are represented by V1 and V2, an in-phase input voltage with respect to said input voltages V1 and V2 is represented by VIQ, a differential input voltage included as a form of an input difference between the two inputs V1 and V2 is represented by $\Delta$VI, two output voltages which appear in said output lines are represented by Vo1 and Vo2, and in-phase output voltage which is commonly included in said output voltages Vo1 and Vo2 is represented by VOQ, a differential output voltage included as a form of an output difference between said output voltages Vo1 and Vo2 is represented by $\Delta$VO, transconductance of said first transistors is represented by Gmp, transconductance of said second transistors is represented by Gmn, transconductance between said output lines and said third electric potential line is represented by Gm, and conductance as a design constant is set to Gds, an in-phase gain VOQ/VIQ of said delay circuit is obtained by the following equation:

$VOQ/VIQ=-(Gmn*Gds/2)/\{(Gmp+Gm)*(Gmn+Gds/2)\}$, said design constant is defined so as to be Gmn>>Gds/2, said equation is re-expressed with a good approximation, when Gmn is eliminated, by means of the following equation:

$VOQ/VIQ=-(Gds/2)/(Gmp+Gm)$, and said design constant Gds is further appropriately set so that said in-phase gain becomes small enough.

12. A delay circuit for a ring oscillator according to claim 11,
characterized in that a differential gain $\Delta$VO/$\Delta$VI is expressed by the following equation:

$\Delta VO/\Delta VI=Gmn/(Gmp-Gm)$, and
values of the parameters Gmn, Gmp and Gm are set so as to be Gmn>(Gmp-Gm).

13. A delay circuit for a ring oscillator according to claim 11,
wherein said delay circuit further comprises:
a fourth electric potential line; and
a bias transistor arranged between said fourth electric potential line and said second electric potential line, conductance between a drain and a source of said bias transistor is said design constant Gds.

14. A delay circuit for a ring oscillator, comprising:
a first electric potential line;
a pair of output lines;
a pair of first transistors arranged between said first electric potential line and said pair of output lines, respectively;
a second electric potential line; and
a pair of second transistors arranged between said second electric potential line and said pair of output lines, respectively,
wherein respective gates of said first transistors are connected to said pair of output lines, respectively, said first transistors are connected to each other center-symmetrically, and said second transistors are connected to each other center-symmetrically, the delay circuit further. comprising a third electric potential line, wherein said pair of output lines are connected to said third electric potential line, wherein if the first transistors are PMOS transistors, the second transistors are NMOS transistors, and if the first transistors are NMOS transistors, the second transistors are PMOS transistors, and further comprises a pair of third transistors arranged between said pair of output lines and said third electric potential line, and gates of said third transistors are connected to said output lines, respectively.

15. A delay circuit for a ring oscillator, comprising:
a first electric potential line;
a pair of output lines;
a pair of first transistors arranged between said first electric potential line and said pair of output lines, respectively;
a second electric potential line;
a pair of second transistors arranged between said second electric potential line and said pair of output lines, respectively; and
a third electric potential line, wherein gates of said first transistors are connected to said pair of output lines, respectively, said first transistors are connected to each other center-symmetrically, and said second transistors are connected to each other center-symmetrically, said pair of output lines are connected to said third electric potential line, wherein if said first transistors are PMOS transistors, said second transistors are NMOS transistors, and if said first transistors are NMOS transistors, said second transistors are PMOS transistors, said delay circuit further comprising:
a pair of third transistors arranged between said pair of output lines and said third electric potential line. and wherein gates of said third transistors are connected to said output lines, respectively, wherein when input voltages applied to gates of said second transistors, respectively, are represented by V1 and V2, an in-phase input voltage with respect to said input voltages V1 and V2 is represented by VIQ, a differential input voltage included as a form of an input difference between the two inputs V1 and V2 is represented by $\Delta$VI, two output voltages which appear in said output lines are represented by Vo1 and Vo2, and in-phase output voltage which is commonly included in said output voltages Vo1 and Vo2 is represented by VOQ, a differential output voltage included as a form of an output difference between said output voltages Vo1 and Vo2 is represented by $\Delta$VO, transconductance of said first transistors is represented by Gmp, transconductance of said second transistors is represented by Gmn, transconductance between said output lines and said third electric potential line is represented by Gm, and conductance as a design constant is set to Gds, an in-phase gain VOQ/VIQ of said delay circuit is obtained by the following equation:

$$VOQ/VIQ = -(Gmn*Gds/2)/\{(Gmp+Gm)*(Gmn+Gds/2)\},$$

said design constant is defined so as to be Gmn>>Gds/2, said equation is re-expressed with a good approximation, when Gmn is eliminated, by means of the following equation:

$$VOQ/VIQ = -(Gds/2)/(Gmp+Gm),$$

and said design constant Gds is further appropriately set so that said in-phase gain becomes small enough.

16. A delay circuit for a ring oscillator according to claim 15, characterized in that a differential gain $\Delta VO/\Delta VI$ is expressed by the following equation:

$$\Delta VO/\Delta VI = Gmn/(Gmp-Gm),$$

and values of the parameters Gmn, Gmp and Gm are set so as to be Gmn>(Gmp−Gm).

17. A delay circuit for a ring oscillator according to claim 16, wherein said delay circuit further comprises:
  a fourth electric potential line; and
  a bias transistor arranged between said fourth electric potential line and said second electric potential line, conductance between a drain and a source of said bias transistor is said design constant Gds.

18. A delay circuit for a ring oscillator, comprising:
a first electric potential line;
a pair of output lines;
a pair of first transistors arranged between said first electric potential line and said pair of output lines, respectively;
a second electric potential line; and
a pair of second transistors arranged between said second electric potential line and said pair of output lines, respectively;
wherein gates of said first transistors are connected to said pair of output lines, respectively, said first transistors are connected to each other center-symmetrically, and said second transistors are connected to each other center-symmetrically,
wherein said delay circuit further comprises a third electric potential line, said pair of output lines being connected to said third electric potential line, and
wherein said delay circuit further includes:
  a first voltage controlling current source connected to one of said pairs of output lines;
  a second voltage controlling current source connected to the other of said pair of output lines,
  wherein a transconductance of said first transistors are set approximately equal to a transconductance of said first and second voltage controlling current sources.

19. A delay circuit for a ring oscillator according to claim 18, wherein if the first transistors are PMOS transistors, the second transistors are NMOS transistors, and if the first transistors are NMOS transistors, the second transistors are PMOS transistors.

20. A delay circuit for a ring oscillator according to claim 17, wherein the transconductance of said first transistors is determined based on channel widths and channel lengths of the gates of said first transistors.

* * * * *